United States Patent
Alim et al.

(10) Patent No.: US 11,585,967 B2
(45) Date of Patent: Feb. 21, 2023

(54) APODIZATION OF REFRACTIVE INDEX PROFILE IN VOLUME GRATINGS

(71) Applicant: Facebook Technologies, LLC, Menlo Park, CA (US)

(72) Inventors: Marvin Dion Alim, Boulder, CO (US); Austin Lane, Bellevue, WA (US); Kavous Jorabchi, Bellevue, WA (US); Yang Yang, Redmond, WA (US); Janee Ashley McNeil, Seattle, WA (US)

(73) Assignee: Meta Platforms Technologies LLC, Menlo Park, CA (US)

( * ) Notice: Subject to any disclaimer, the term of this patent is extended or adjusted under 35 U.S.C. 154(b) by 88 days.

(21) Appl. No.: 17/176,964

(22) Filed: Feb. 16, 2021

(65) Prior Publication Data

US 2022/0120946 A1   Apr. 21, 2022

Related U.S. Application Data

(60) Provisional application No. 63/114,226, filed on Nov. 16, 2020, provisional application No. 63/092,288, filed on Oct. 15, 2020.

(51) Int. Cl.
*G02B 5/18* (2006.01)
*G02B 6/34* (2006.01)
*G02B 1/04* (2006.01)

(52) U.S. Cl.
CPC ............ *G02B 5/1857* (2013.01); *G02B 1/04* (2013.01); *G02B 6/34* (2013.01)

(58) Field of Classification Search
CPC .......... G02B 5/1857; G02B 1/04; G02B 6/34; G02B 2005/1804; G02B 2027/0174;
(Continued)

(56) References Cited

U.S. PATENT DOCUMENTS 4,983,003 A * 1/1991 Wreede ............... G03H 1/02
                                                    359/3
6,567,573 B1 * 5/2003 Domash ............. G02F 1/011
                                                    385/24

(Continued)

FOREIGN PATENT DOCUMENTS

| EP | 0370626 A2 | 5/1990 |
| WO | 8603852 A1 | 7/1986 |
| WO | 8605286 A1 | 9/1986 |

OTHER PUBLICATIONS

Seiichiro Murase and Kazuyuki Horie "Large Photoinduced Refractive Index Changes of Transparent Polymer Films Containing Photoeliminable Diazo and Azido Groups" Macromolecules 1999, 32, 4, pp. 1103-1110.

(Continued)

*Primary Examiner* — Ellen E Kim
(74) *Attorney, Agent, or Firm* — Pequignot + Myers; Matthew A. Pequignot

(57) ABSTRACT

A grating coupler may be fabricated by exposing a photopolymer layer to grating forming light for forming periodic refractive index variations in the photopolymer layer. The photopolymer layer may be exposed to apodization light for reducing an amplitude of the periodic refractive index variations in a spatially-selective manner. The apodization may also be achieved or facilitated by subjecting outer surface(s) of the photopolymer layer to a chemically reactive agent that causes the refractive index contrast to be reduced near the surface(s) of application. The apodized refractive index profile of the gratings facilitates the reduction of optical crosstalk between different gratings of the grating coupler.

18 Claims, 15 Drawing Sheets

(58) Field of Classification Search
CPC ............ G02B 27/0081; G02B 27/0172; G03H 2001/0264; G03H 2001/184; G03H 2222/34; G03H 2240/24; G03H 2240/54; G03H 2260/12; G03H 1/0248; G03H 1/181; G03H 1/2645; G03H 1/0465; G03H 1/182; G11B 7/245; G11B 7/24044; G03F 7/0005; G03F 7/027; G03F 7/039; G03F 7/2022; G03F 7/095; G03F 7/203

See application file for complete search history.

(56) References Cited

U.S. PATENT DOCUMENTS

| | | | | |
|---|---|---|---|---|
| 8,257,885 | B1* | 9/2012 | Efimov | G02B 5/1857 430/1 |
| 2006/0147811 | A1* | 7/2006 | Stepanov | G02B 5/1857 430/1 |
| 2010/0328741 | A1* | 12/2010 | Cheverton | G03H 1/28 359/2 |
| 2011/0236803 | A1* | 9/2011 | Weiser | G03F 7/031 430/2 |
| 2015/0131942 | A1* | 5/2015 | Xu | G02B 6/34 385/37 |
| 2018/0188689 | A1* | 7/2018 | Ziegler | G03H 1/265 |
| 2019/0207362 | A1* | 7/2019 | Kong | G02B 6/34 |

OTHER PUBLICATIONS

Invitation to Pay Additional Fees for International Application No. PCT/US2021/059548, mailed May 10, 2022, 8 pages.

International Search Report and Written Opinion for International Application No. PCT/US2021/059548, dated Jul. 4, 2022, 14 pages.

E. A. Chandross; C.A. Pryde; W.J. Tomlinson, and H.P. Weber "Photolocking—A new technique for fabricating optical waveguide circuits" Appl. Phys. Lett., 1974, 24, 72 Aug. 31, 1973.

Hiroto Kudo et al., "New Large Refractive-Index Change Materials: Synthesis and Photochemical Valence Isomerization of the Calixarene Derivatives Containing Norbornadiene Moieties" Bull. Chem. Soc. Jpn., 77, 1415-1422 (2004)) Jul. 9, 2004.

Messio Zanutta et al., "Understanding the mechanism of refractive index modulation in materials undergoing photo-Fries rearrangement" Optical Materials 35 (2013) 2283-2289.

International Search Report and Written Opinion for International Application No. PCT/US2021/055034, dated Mar. 14, 2022, 14 pages.

Invitation to Pay Additional Fees for International Application No. PCT/US2021/055034, mailed Jan. 20, 2022, 9 pages.

* cited by examiner

APODIZATION OF REFRACTIVE INDEX PROFILE IN VOLUME GRATINGS

REFERENCE TO RELATED APPLICATIONS

The present application claims priority from U.S. Provisional Application No. 63/092,288 filed on Oct. 15, 2020 and entitled "Photoinduced Apodization of Refractive Index Profile in Volume Bragg Gratings", and from U.S. Provisional Application No. 63/114,226 filed on Nov. 16, 2020 and entitled "Chemical Diffusion Treated Volume Holograms and Methods for Making the Same", both of which being incorporated herein by reference in their entireties.

TECHNICAL FIELD

The present disclosure relates to optical devices, and in particular to optical gratings and lightguides using optical gratings.

BACKGROUND

An artificial reality system may include a near-eye display (e.g., a headset or a pair of glasses) configured to present content to a user. The near-eye display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by seeing through a "combiner" component, which is a physical structure where display light and environmental light merge as one within the user's field of view. The combiner of a wearable heads-up display is typically transparent to environmental light but includes some light routing optic to direct the display light into the user's field of view.

Wearable heads-up displays may employ lightguides as transparent or translucent combiners. Lightguides typically consist of plates of a transparent material with a higher refractive index then the surrounding medium, usually air. Light input into the plate propagates along the length of the plate as long as the light continues to be incident at boundaries between the plate and the surrounding medium at an angle above the critical angle. Lightguides employ in-coupling and out-coupling elements to ensure that light follows a specific path along the waveguide and then exits the waveguide at specific location(s) to create an image visible to the user. The in-coupling and out-coupling elements need to accurately convey the angular distribution of brightness of the in-coupled light beam to the user's eyes to prevent distortion and splitting of the displayed images.

BRIEF DESCRIPTION OF THE DRAWINGS

Exemplary embodiments will now be described in conjunction with the drawings, in which.

DETAILED DESCRIPTION

Figure 1A:
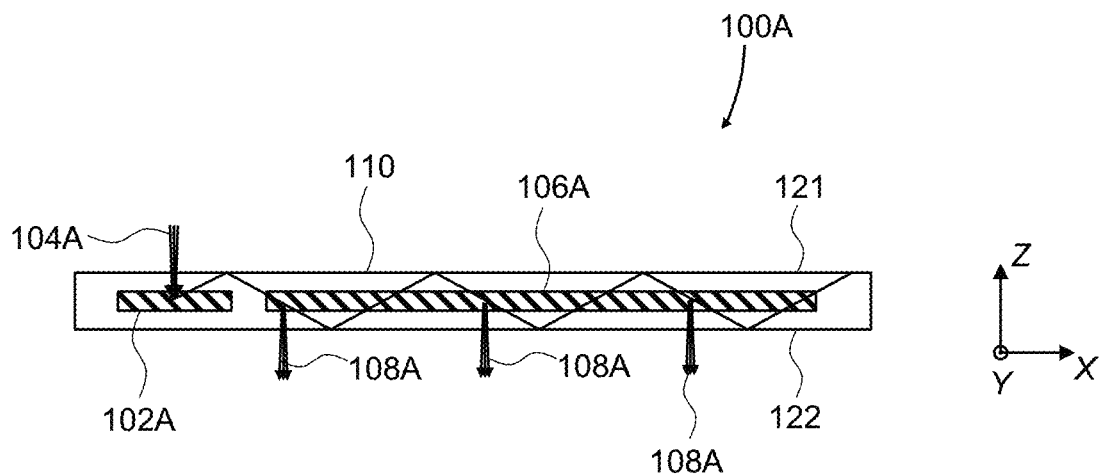
FIGS. 1A and 1B are side cross-sectional views of pupil-replicating lightguides having input and output volume gratings, the pupil-replicating lightguide of FIG. 1A being configured to provide a different portion of field of view (FOV) than the pupil-replicating lightguide of FIG. 1B.

While the present teachings are described in conjunction with various embodiments and examples, it is not intended that the present teachings be limited to such embodiments. On the contrary, the present teachings encompass various alternatives and equivalents, as will be appreciated by those of skill in the art. All statements herein reciting principles, aspects, and embodiments of this disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As used herein, the terms "first", "second", and so forth are not intended to imply sequential ordering, but rather are intended to distinguish one element from another, unless explicitly stated. Similarly, sequential ordering of method steps does not imply a sequential order of their execution, unless explicitly stated.

Lightguides are used in optical devices to carry light from one location to another. Pupil-replicating lightguides are used in near-eye displays for providing multiple laterally offset copies of a fan of light beams carrying an image in angular domain for observation by a user of a near-eye display. The multiple offset copies of the beam fan are spread over an eyebox of the display, making observation of the image less dependent on the eye position in the eyebox.

Pupil-replicating lightguides may use diffraction gratings for in-coupling and out-coupling image light. Volume gratings, such as volume Bragg gratings (VBGs) or volume holograms, for example, can in-couple and out-couple image light with high efficiency. VBGs however typically operate in a rather narrow angular range. To increase the overall angular range, multiple pairs of in-coupling and out-coupling VBGs may be provided in a pupil-replicating lightguide. VBGs of different pairs may have optical crosstalk. When the image light is reflected by an out-coupling VBG after being in-coupled by an in-coupling VBG of a different VBGs pair, a ghost image may appear.

In accordance with this disclosure, optical crosstalk and resulting image ghosting and contrast/clarity reduction may be lessened by apodizing the refractive index profile of volume gratings in a direction of thickness of the pupil-replicating lightguide. Such apodization may be achieved chemically and/or photochemically. In a photochemical apodization process, one or both surfaces of a photopolymer layer are exposed to apodization light for reducing an amplitude of the periodic refractive index variations. Since most light is present proximate to the surface(s) being illuminated, the grating gets apodized in the direction of grating thickness. In a chemical apodization process, one or both surfaces of the photopolymer layer are exposed to a reactant that reduces an amplitude of the periodic refractive index variations near the one or both surfaces. In some embodiments, both the chemical and photochemical apodization processes may be used to achieve the required grating apodization profiles.

In accordance with this disclosure, there is provided a method of fabrication of a grating coupler. The method comprises exposing a photopolymer layer having a thickness between opposed first and second surfaces to grating forming light for forming periodic refractive index variations in the photopolymer layer. The first surface of the photopolymer layer is exposed to apodization light for reducing an amplitude of the periodic refractive index variations proximate the first surface. The method may include exposing the second surface of the photopolymer layer to apodization light for reducing an amplitude of the periodic refractive index variations proximate the second surface. The first surface of the photopolymer layer may be exposed to the apodization light before the photopolymer layer is exposed to the grating forming light.

In embodiments where a wavelength of the grating forming light is different from a wavelength of the apodization light, the apodization light may be absorbed in the photopolymer layer stronger than the grating forming light. For example, a transmittance of the photopolymer layer at the wavelength of the apodization light may no greater than 5%. The periodic refractive index variations in the photopolymer layer may be formed due to a photoreactive agent of the photopolymer layer being sensitive to illumination with the grating forming light. The amplitude of the periodic refractive index variations may be reduced due to the photoreactive agent being sensitive to illumination with the apodization light. A duration of the exposure of the photopolymer layer to the apodization light may be shorter than a duration of the exposure of the photopolymer layer to the grating forming light.

In some embodiments, the exposure of the photopolymer layer to the apodization light is performed concurrently with the exposure of the photopolymer layer to the grating forming light. The photopolymer layer may include a photoreactive agent for forming the periodic refractive index variations by a photoreaction to the grating forming light, and a photoinhibitor agent for impeding the photoreaction when illuminated with the apodization light. A wavelength of the grating forming light may be different from a wavelength of the apodization light. The grating forming light may substantially not activate the photoinhibitor agent, and the apodization light may substantially not activate the photoreactive agent. The photoreaction may include photopolymerization, and the photoinhibitor agent may undergo photolysis when illuminated with the apodization light to produce a radical for impeding the photopolymerization. The photoinhibitor agent may include e.g. at least one of butyl nitrite, hexaarylbiimidazole, or tetraethylthiuram disulfide.

In some embodiments, the exposure of the photopolymer layer to the apodization light is performed after the exposure of the photopolymer layer to the grating forming light. The photopolymer layer may include a photoreactive group that reduces the amplitude of the periodic refractive index variations upon illumination with the apodization light by at least one of photoisomerization, photoelimination, photopolymerization, or photolocking. For example, photoreactive group may include at least one of azobenzene, stilbene, spiropyran, diarylethene, a diazo group, or an azido group. The photoreactive group may be on a polymer backbone of the photopolymer layer.

In accordance with this disclosure, there is provided a method of fabrication of a grating coupler. The method includes exposing a photopolymer layer having a thickness between opposed first and second surfaces to grating forming light for forming periodic refractive index variations in the photopolymer layer, and exposing at least the first surface of the photopolymer layer to a reactive agent for reducing an amplitude of the periodic refractive index variations proximate the first surface.

In embodiments where a photopolymer of the photopolymer layer comprises a photopolymerizable group connected to an end group by an acid-cleavable linker group, and where a local refractive index is defined, at least in part, by the end group, the reactive agent may include an acid for separating the end group from the photopolymerizable group. In operation, the end group diffuses away upon being separated from the corresponding photopolymerizable group by application of the acid to the at least first surface, thereby reducing the amplitude of the periodic refractive index variations proximate the at least first surface.

In accordance with this disclosure, there is further provided a grating coupler for a waveguide. The grating coupler includes a photopolymer layer having a thickness between opposed first and second surfaces, the photopolymer layer comprising periodic refractive index variations due to exposure to grating forming light. An amplitude of the periodic refractive index variations proximate the first surface and/or the second surface may be reduced by at least one of: exposing the first surface the photopolymer layer to apodization light; or exposing the first surface the photopolymer layer to a reactive agent. The periodic refractive index variations in the photopolymer layer may be formed due to a photoreactive agent of the photopolymer layer being sensitive to illumination with the grating forming light. The amplitude of the periodic refractive index variations may be reduced due to the photoreactive agent being sensitive to illumination with the apodization light.

Examples of lightguides with apodized gratings will now be presented. Referring first to FIG. 1A, a pupil-replicating lightguide 100A includes a substrate 110 and an in-coupling grating 102A in the substrate 110 for in-coupling image light 104A into the pupil-replicating lightguide 100A, and an out-coupling grating 106A in the substrate 110 for out-coupling portions 108A of the image light 104A along a length direction of the pupil-replicating lightguide 100A (X-direction in FIG. 1A). The image light 104A propagates in the substrate by series of reflections from opposed top 121 and bottom 122 surfaces of the substrate 110. The image light 104A carries a portion of an image in angular domain, corresponding to a narrow cone of rays oriented approximately perpendicular to the pupil-replicating lightguide 100A, as shown in FIG. 1A. In this example, the in-coupling grating 102A and the out-coupling grating 106A have a same pitch, such that the out-coupled portions 108A retain the beam angles of the impinging image light 104A.

Figure 1B:
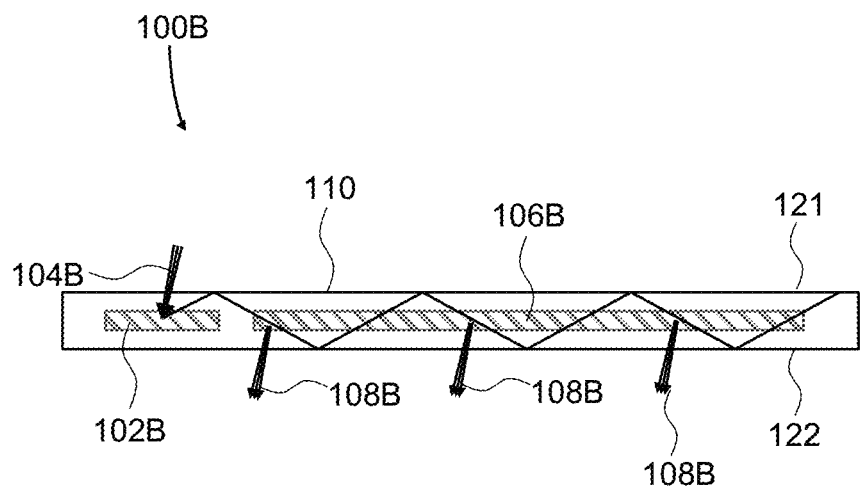

Referring to FIG. 1B, a pupil-replicating lightguide 100B is similar to the pupil-replicating lightguide 100A of FIG. 1A. The pupil-replicating lightguide 100B of FIG. 1B includes an in-coupling grating 102B in the substrate 110 for in-coupling image light 104B and an out-coupling grating 106B in the substrate 110 for out-coupling portions 108B of the image light 104A along a length direction of the pupil-replicating lightguide 100B (X-direction in FIG. 1B). The image light 104B propagates in the substrate by series of reflections from opposed top 121 and bottom 122 surfaces of the substrate 110. The image light 104B carries a different portion of the image in angular domain, corresponding to a narrow cone of rays oriented at an acute, i.e. non-perpendicular, angle to the pupil-replicating lightguide 100B. The in-coupling grating 102B and the out-coupling grating 106B have a same pitch, such that the out-coupled portions 108B retain the beam angles of the impinging image light 104B.

Figure 2:
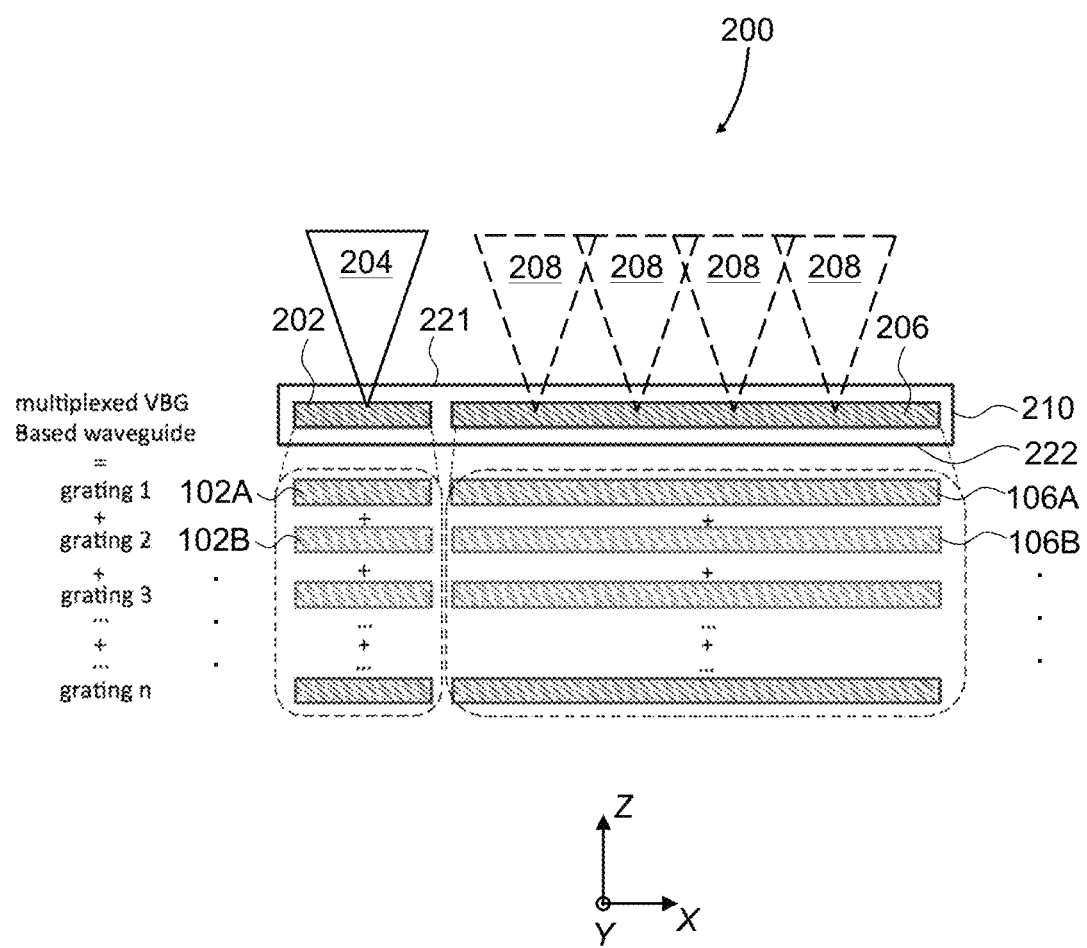
FIG. 2 is a side cross-sectional views of a pupil-replicating lightguide having multiplexed volume gratings of FIGS. 1A and 1B for a broader overall FOV.

Referring now to FIG. 2, a pupil-replicating lightguide 200 includes an in-coupler 202 in a substrate 210. The in-coupler 202 includes a plurality of multiplexed in-coupling gratings, e.g. the in-coupling grating 102A of FIG. 1A, the in-coupling grating 102b of FIG. 1B, and other in-coupling gratings of different pitches or periods, superimposed in the pupil-replicating lightguide 200. The volume gratings may occupy a same volume area of the substrate 210, and/or may be disposed at different depths in the substrate 210. Different gratings of the plurality of in-coupling gratings are configured to in-couple the image light 204 impinging onto the substrate 210 at different angles of incidence. Together, the in-coupling gratings in-couple image light 204 covering an entire field of view (FOV) of an image in angular domain to be carried by the pupil-replicating lightguide 200 and displayed to a user. The in-coupled image light 204 propagates in the substrate by series of reflections from opposed top 221 and bottom 222 surfaces of the substrate 210.

An out-coupler 206 in the substrate 210 includes a plurality of multiplexed out-coupling gratings, e.g. the out-coupling grating 106A of FIG. 1A, the out-coupling grating 106b of FIG. 1B, and other out-coupling gratings, superimposed in the pupil-replicating lightguide 200. Different gratings of the plurality of out-coupling gratings are configured to out-couple the image light 204 propagating in the substrate 210 at different angles of diffraction. Together, the out-coupling volume gratings out-couple portions 208 of the image light 204 covering the entire FOV. Different portions of the FOV are being conveyed by the pupil-replicating lightguide 200 by different matching pairs of gratings. It is further noted that one out-coupling grating per an in-coupling grating is only meant as an example. Two or more out-coupling gratings may be provided per each in-coupling grating. Various lightguide types, including straight lightguides, curved lightguides, 1D/2D lightguides, etc., may be configured to have matching grating pairs.

For the pupil-replicating lightguide 200 to operate as intended, the image light 204 portions should be redirected only by gratings of a same in-coupling and out-coupling volume grating pair, corresponding to a same particular FOV portion. If a portion of the image light 204 is in-coupled into the pupil-replicating lightguide 200 by a volume grating from one in-coupling/out-coupling volume grating pair, and is out-coupled by a grating from another in-coupling/out-coupling volume grating pair, an offset image (ghosting) will result.

Figure 3A:
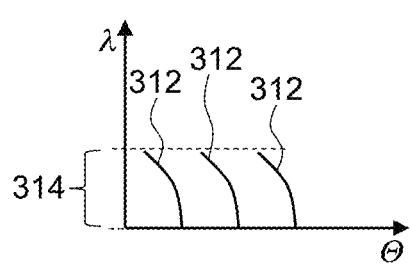
FIG. 3A is an angular dependence of diffraction wavelengths of a plurality of sparsely spaced volume gratings usable in the pupil-replicating lightguide of FIG. 2.
Figure 3B:
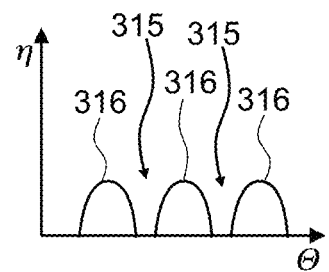
FIG. 3B is an angular dependence of diffraction efficiency of the plurality of volume gratings of FIG. 3A.

Origins of the optical crosstalk between different volume grating pairs are further illustrated in FIGS. 3A to 3F. Referring first to FIGS. 3A and 3B, a grating coupler may include a plurality of volume gratings having angular dependencies 312 of diffraction wavelength $\lambda$ (FIG. 3A) offset relative to one another along an axis of the diffraction angle $\Theta$, due to the volume gratings having different pitches. The angular dependencies 312 are shown for a bandwidth 314 of illuminating light. The angular dependencies 312 are sparsely spaced in the diffraction angle $\Theta$ in this example, which results in gaps 315 between plots 316 of angular dependence of diffraction efficiency $\eta$ of the individual volume gratings (FIG. 3B). When such grating coupler is used in a pupil-replicating lightguide, the gaps 315 will result in FOV gaps in the displayed image.

Figure 3C:
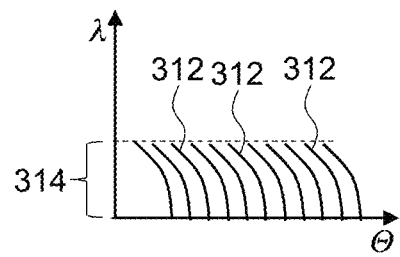
FIG. 3C is an angular dependence of diffraction wavelengths of a plurality of densely spaced volume gratings usable in the pupil-replicating lightguide of FIG. 2.
Figure 3D:
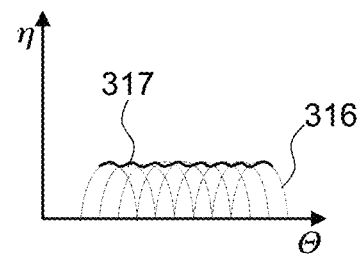
FIG. 3D is an angular dependence of diffraction efficiency of the plurality of volume gratings of FIG. 3C.

The gaps 315 may be avoided by providing tighter spacing between the pitch values of the gratings multiplexed in a grating coupler, which will cause the angular dependencies 312 to be spaced closer together. Referring to FIGS. 3C and 3D, the angular dependencies 312 are densely spaced in angle (FIG. 3C), eliminating gaps between angular efficiency plots 316. The angular efficiency plots 316 "coalesce" in a continuous, gap-free angular efficiency curve 317 (FIG. 3D). The grating coupler with the densely spaced (in angular domain) volume gratings will result in a continuous, gap-free FOV.

Figure 3E:
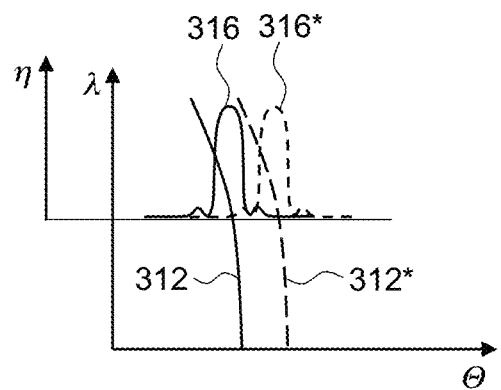
FIG. 3E is a magnified view of the angular dependence of FIG. 3C superimposed with local diffraction efficiency plots for two neighboring volume gratings.

Too close a spacing of the grating pitches and resulting gap-free FOV may result in optical crosstalk, which manifests itself in image contrast loss and/or the appearance of ghost images. Referring to FIG. 3E for example, angular dependencies 312, 312* of first and second diffraction wavelengths of neighboring gratings (i.e. neighboring in pitch) are shown superimposed with corresponding magnified first and second diffraction efficiency curves 316, 316* for these gratings. When the first and second diffraction efficiency curves 316, 316* are disposed too close to each other, crosstalk may result causing the light to be diffracted by a "wrong" grating.

Figure 3F:
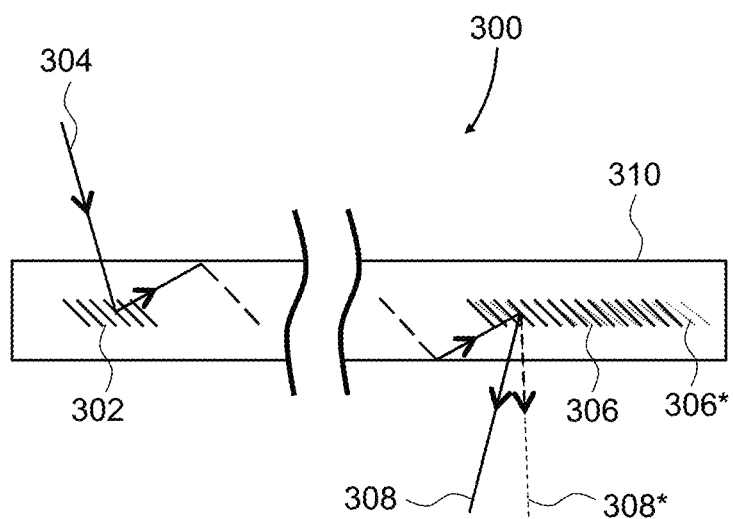
FIG. 3F is a side cross-sectional view of a pupil-replicating lightguide illustrating optical crosstalk.

The latter point is illustrated in FIG. 3F showing a pupil-replicating lightguide 300. A light beam 304 impinges onto an in-coupler comprising a plurality of in-coupling gratings, including a first in-coupling volume grating 302, in a substrate 310. The other in-coupling gratings are not shown for clarity. The in-coupling grating 302 redirects the light beam 304 to propagate in the pupil-replicating lightguide 300 towards an out-coupler comprising a plurality of out-coupling gratings in the substrate 310. The out-coupler includes a first out-coupling grating 306 matching the first in-coupling grating 302 and having the first angular dependence 316 (FIG. 3E) of diffraction efficiency η, and a second out-coupling grating 306* (FIG. 3F) having the second angular dependence 316* of diffraction efficiency η. Only two out-coupling gratings are shown in FIG. 3F for clarity. The fringes of the in-coupling and out-coupling gratings may form an acute angle with the substrate 310, as shown in FIG. 3F.

In operation, a first output light beam 308 diffracts from a "correct", i.e. the matching first out-coupling grating 306. A second output light beam 308* diffracts from a "wrong" grating, i.e. the second out-coupling grating 306*. The second output light beam 308* propagates in a different direction than the first output light beam 308 because the second out-coupling grating has a slightly different pitch than the first out-coupling grating. The second output light beam 308* carries an incorrect image, i.e. a ghost image.

Figure 4A:
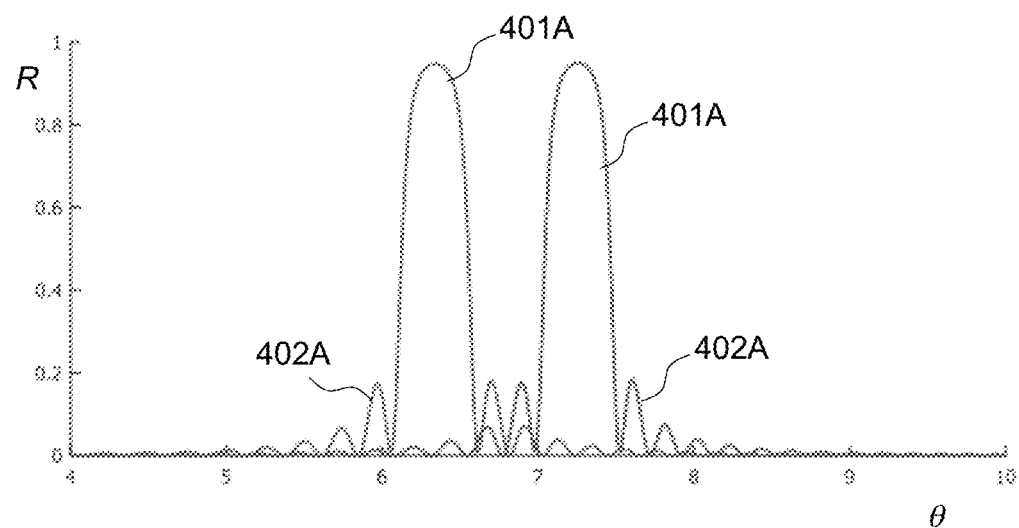
FIG. 4A is an angular reflectivity plot of two non-apodized volume gratings in the pupil-replicating lightguide of FIG. 2.

The origins of the "incorrect" reflection are further illustrated in FIG. 4A, where reflectivity R of two adjacent volume gratings is plotted against an angle of reflective diffraction θ in degrees. The reflectivity R corresponds to the diffraction efficiency η in a reflective volume grating configuration. For each grating, the reflectivity dependence on the angle of diffraction R(θ) includes a central peak 401A and sidelobes 402A on both sides of the central peak 401A. It is seen that the sidelobes 402A of one grating may overlap with an area of the central peak 401A of the other grating. The overlap means that, while most of the image light is reflected by the central reflectivity peak 401A of the "correct" grating as the first output light beam 308 (FIG. 3F), a small portion of the image light may be reflected by a sidelobe of the "incorrect" grating producing the second output light beam 308*. It is the diffraction on the "incorrect" output gratings that causes the contrast loss/image ghosting to occur. Therefore, the sidelobes 402A of the reflectivity dependences R(θ) are undesirable, because they degrade the image quality.

Figure 4B:
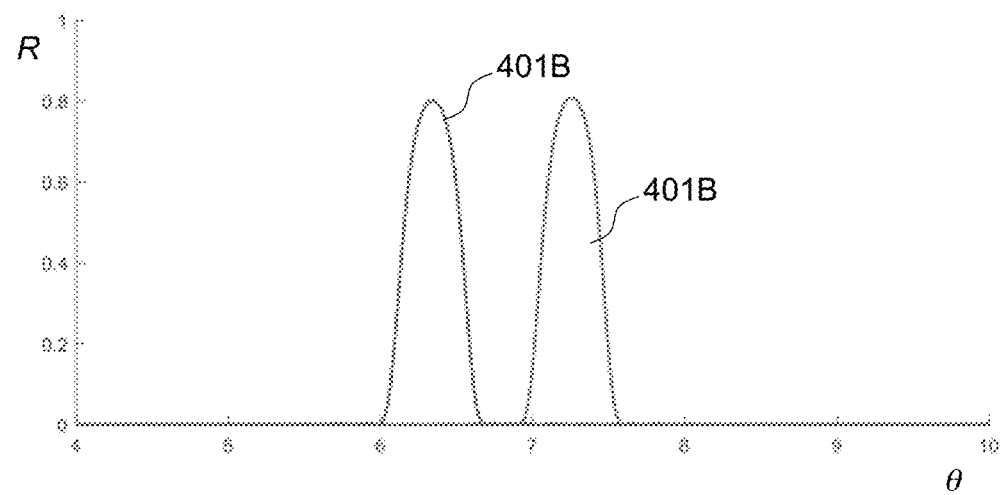
FIG. 4B is an angular reflectivity plot of two apodized volume gratings in the pupil-replicating lightguide of FIG. 2.

In accordance with this disclosure, sidelobes of an angular reflectivity plot of a volume grating and associated image ghosting may be suppressed by apodizing the grating along a thickness dimension of the substrate hosting the grating, i.e. generally in a direction substantially perpendicular to a pitch direction of the array of fringes of the grating. In FIG. 4B, a reflectivity R of apodized gratings from two adjacent grating pairs is plotted against an angle of reflective diffraction Bin degrees. Only central peaks 401B are present, without any sidelobes. Accordingly, the image light may not reflect from an "incorrect" grating of a grating pair, resulting in a ghost-free image. At least, image ghosts may be considerably suppressed. It is noted that gratings in grating couplers considered herein may also operate in transmission instead of reflection.

Figure 4C:
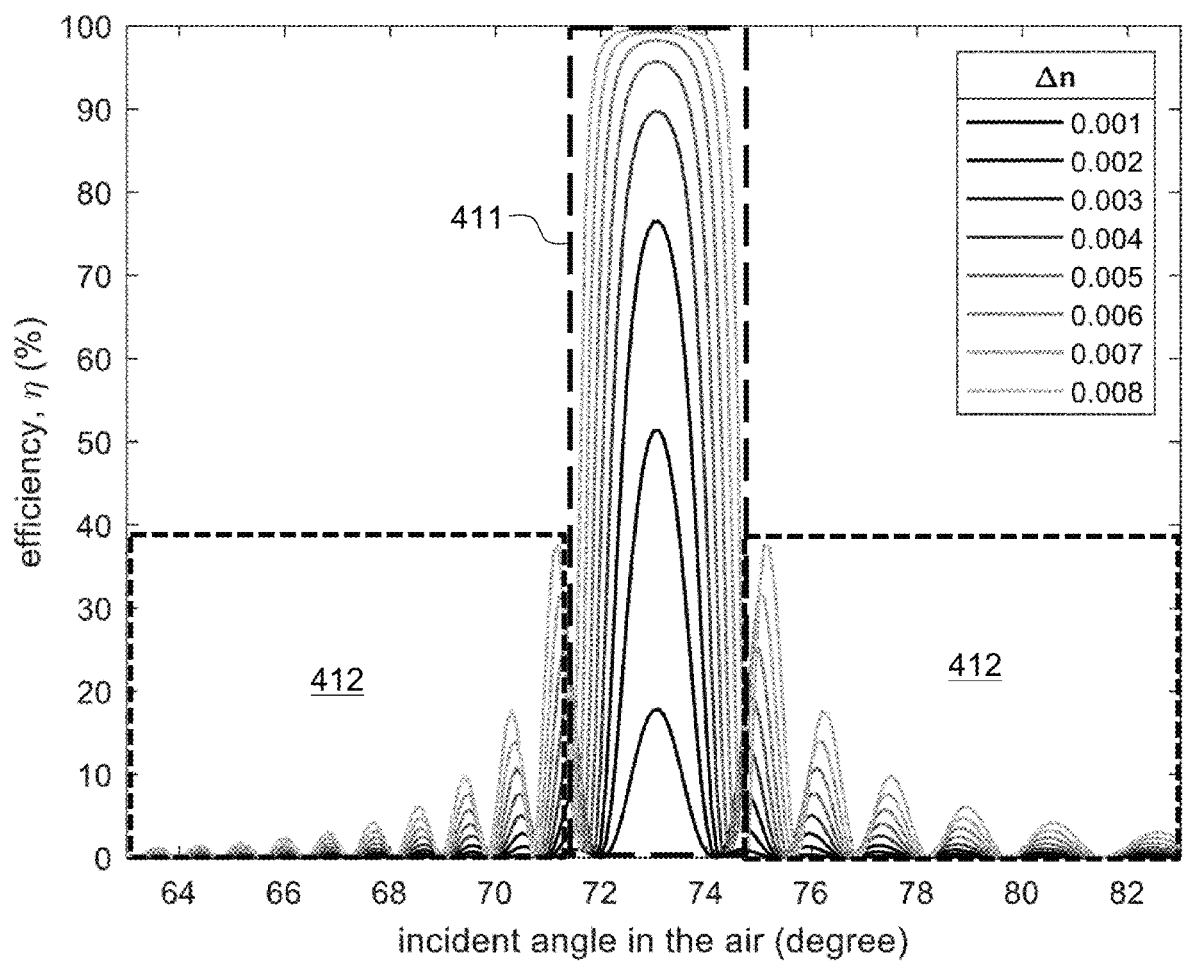
FIG. 4C is a combined angular reflectivity plot of volume gratings with different refractive index contrast Δn.

Referring to FIG. 4C, an angular dependence of reflectivity R of a volume grating is plotted for non-apodized gratings with different grating strength, i.e. with different amplitude of the refractive index variation Δn. For an optimal performance, an apodized volume grating should have as high as possible refractive index contrast in a central peak area 411, and as low as possible refractive index contrast in sidelobe areas 412.

Figure 5:
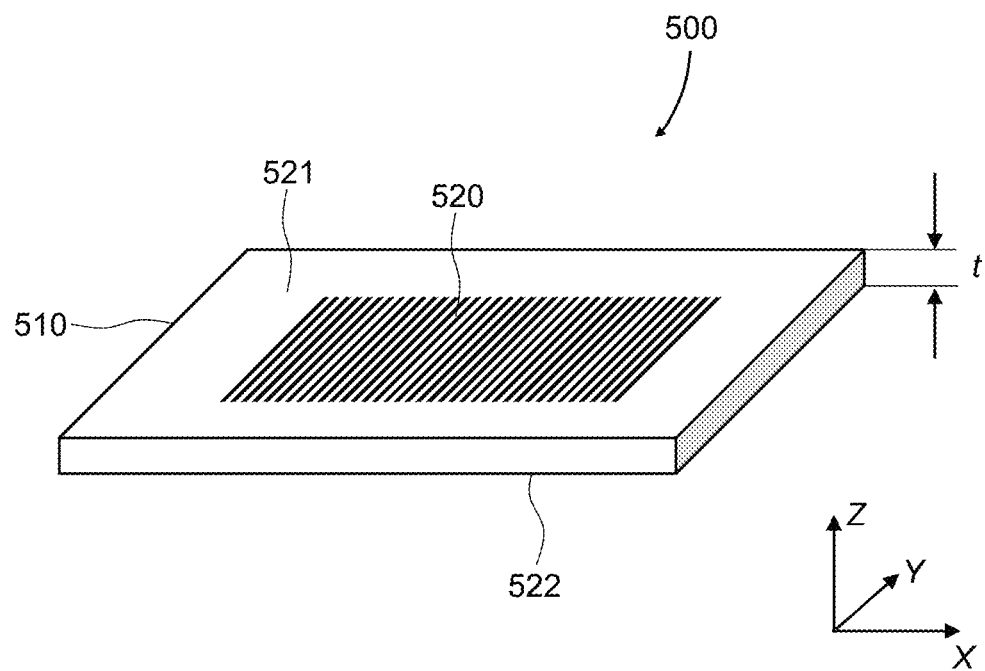
FIG. 5 is a three-dimensional view of an optical coupler including a photopolymer layer and a volume grating written in the photopolymer layer.

Referring now to FIG. 5, an optical coupler 500 may be a part of the pupil-replicating lightguide 100A of FIG. 1A, the pupil-replicating lightguide 100B of FIG. 1B, the pupil-replicating lightguide 200 of FIG. 2, and the pupil-replicating lightguide 300 of FIG. 3F. The optical coupler 500 includes a photopolymer (PP) layer 510 having opposed first 521 and second 522 surfaces parallel to XY plane. The direction of thickness t of the substrate is Z-direction in FIG. 5. The PP layer 510 may, but does not have to be, flat. The optical coupler 500 represents an in-coupler for in-coupling an impinging light beam, as well as an out-coupler for out-coupling portions of the light beam at different locations along the PP layer 510. The optical coupler 500 may include a plurality of volume gratings 520, e.g. at least 10, 20, 50, 100, or more volume gratings having different grating pitches, written in the photopolymer material of the PP layer 510.

The volume gratings 520 may be formed by exposing the PP layer 510 to grating forming light e.g. an interference pattern of two coherent light beams illuminating opposed top 521 and bottom 522 surfaces with oblique coherent beams light. Other configurations, e.g. non-oblique beams, non-opposing beams, are also possible. The photopolymer material of the PP layer 510 changes its refractive index in areas of high intensity of the grating forming light, while in areas of low intensity of the grating forming light the refractive index remains unchanged, or changes very little.

Figure 6:
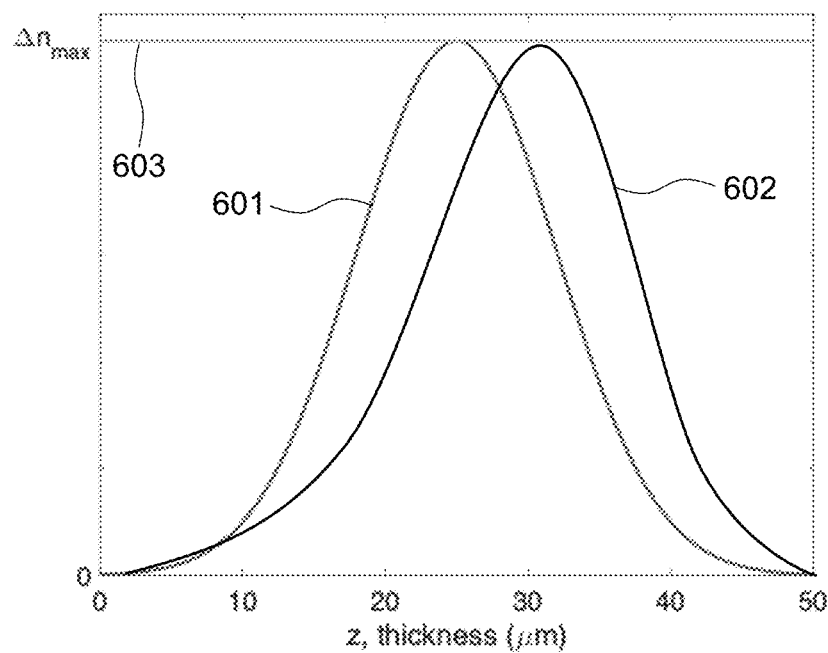
FIG. 6 shows example apodization profiles of volume gratings in the optical coupler of FIG. 5.

Turning to FIG. 6 with further reference to FIG. 5, a profile 601 of a refractive index contrast, that is, a difference between a refractive index of the volume grating fringes and a refractive index of the PP layer 510, is plotted as a function of the thickness coordinate Z. The first profile 601 is described by a Gaussian function in this example. Non-Gaussian function may also be used. More generally, the refractive index contrast variation of each volume grating of the plurality of volume gratings may have a bell-shaped or a similar function. The bell-shaped function may have the tip of the bell inside the PP layer 510 and the lip of the bell at outer surfaces of the PP layer 510. In other words, the bell-shaped function may monotonically increase towards a center thickness of the PP layer 510 from both outer surfaces (i.e. top and bottom surfaces in FIG. 5) of the PP layer 510. The maximum may, but does not have to, be disposed proximate a middle of the thickness t of the PP layer 510. For example, in some embodiments the bell-shaped profile may be skewed toward one side, such as a second profile 602. The fringes of the grating couplers disposed in the PP layer 510 may form an acute angle with the PP layer 510, while their refractive index contrast varies according to the first 601 or second 602 profiles. A uniform profile 603, i.e. that of a non-apodized grating, is also shown for a comparison. Different volume gratings may spatially overlap in the PP layer 510 while having a same or a different z-profile of the refractive index contrast.

The grating apodization may be achieved by illuminating at least one of the top 521 and bottom surfaces 522 of the PP layer 510 with apodization light beams, which may be oriented e.g. along Z-direction. A wavelength or wavelengths of the apodization light may be selected such that at least a major portion of the apodization light is absorbed before reaching the middle of the photopolymer layer. The illumination of the PP layer 510 with the apodization light may facilitate the reduction of the refractive index contrast near the top 521 and bottom 522 surfaces of the PP layer 510, which causes the grating to be apodized.

Figure 7A:
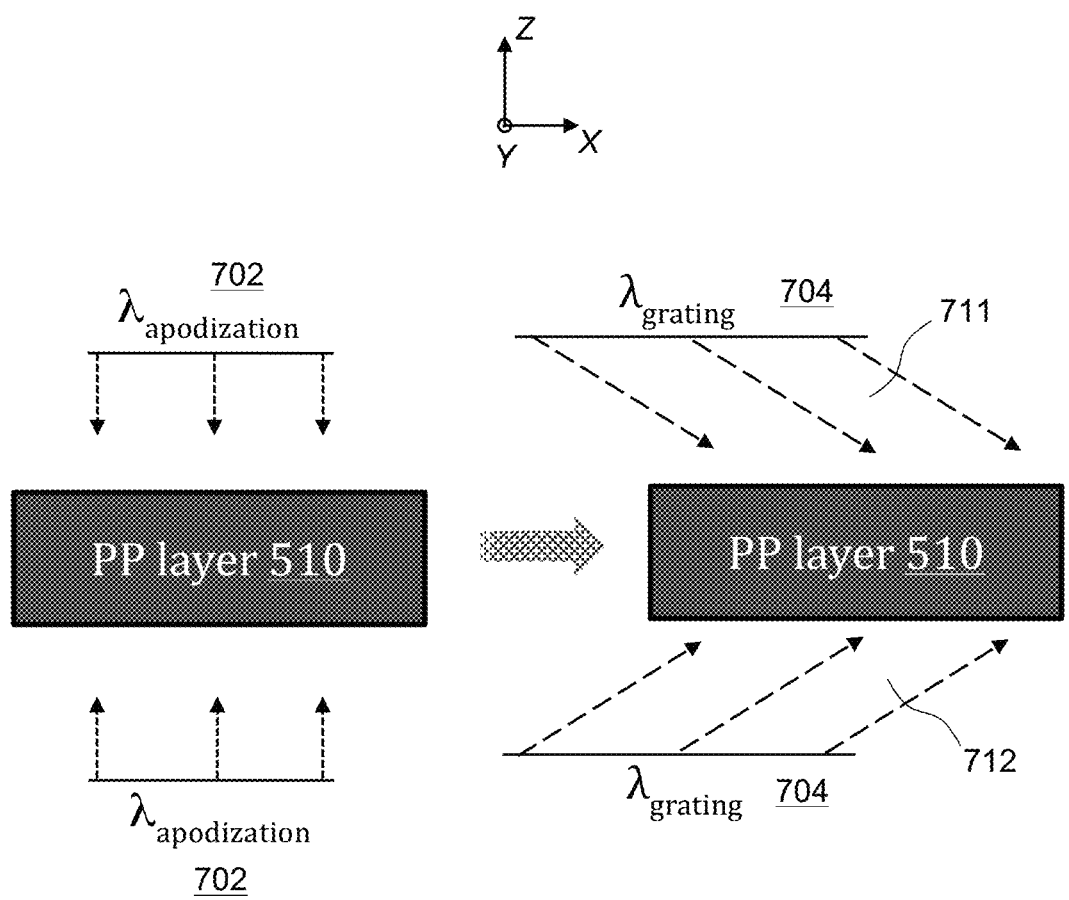
FIG. 7A is a schematic diagram of exposing a photopolymer layer with apodization light and grating forming light where the apodization exposure precedes the grating forming exposure.
Figure 7B:
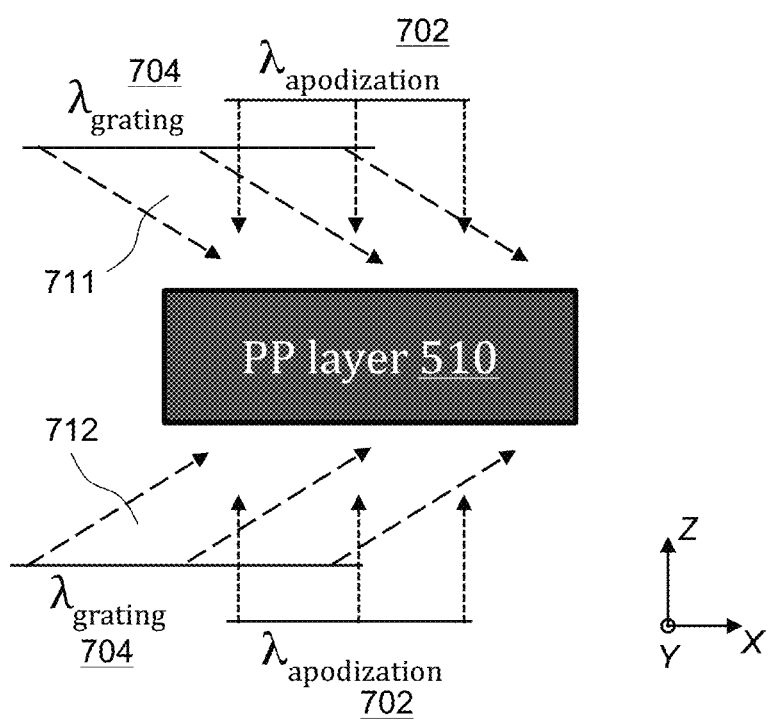
FIG. 7B is a schematic diagram of exposing a photopolymer layer with apodization light and grating forming light where the apodization exposure and the grating forming exposure are performed concurrently.
Figure 7C:
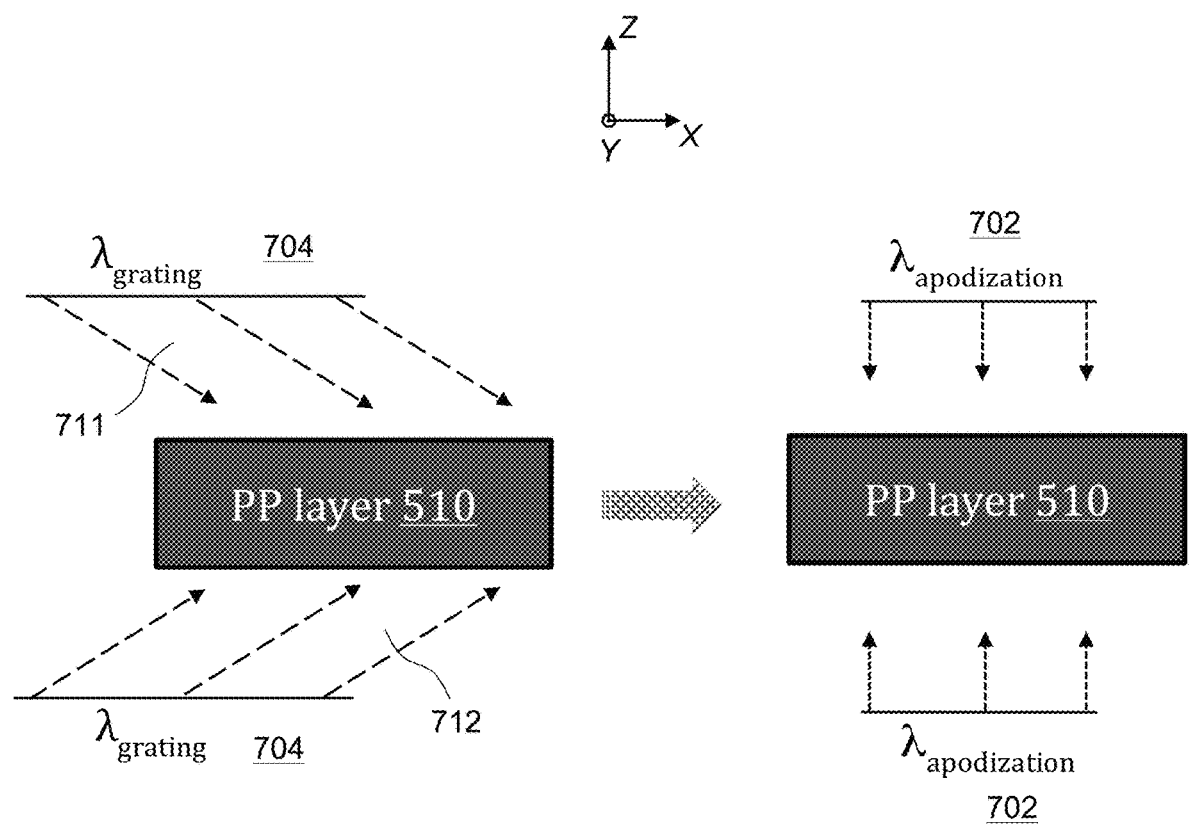
FIG. 7C is a schematic diagram of exposing a photopolymer layer with apodization light and grating forming light where the apodization exposure is performed after the grating forming exposure.

Referring now to FIGS. 7A, 7B, and 7C, example exposure sequences and geometries of the photopolymer layer or film are presented as a non-limiting illustration. In FIG. 7A, the PP layer 510 is first exposed to apodization light 702, and is then exposed to grating forming light 704. The apodization light 702 at a wavelength $\lambda_{apodization}$ may uniformly illuminate the PP layer 510 from top and/or bottom, with illuminating light beams oriented along Z-direction. The illuminating beams may be coherent or non-coherent.

The grating forming light 704 at a grating forming wavelength $\lambda_{grating}$ may include coherent first 711 and second 712 collimated light beams illuminating the PP layer 510 at an acute angle, such that the interference pattern formed by the first 711 and second 712 beams includes a periodic pattern of high and low intensity areas (i.e. optical interference fringes) in the PP layer 510. A variety of grating configurations, e.g. ones with curved, tilted grating fringes, 2D grating, etc., or any other grating configuration may be provided.

FIG. 7B corresponds to a situation where the PP layer 510 is concurrently exposed to the apodization light 702 and the grating forming light 704.

FIG. 7C illustrates a situation where the PP layer 510 is first exposed to grating forming light 704, and then is exposed to the apodization light 702.

In the embodiments of FIGS. 7A, 7B, and 7C, the exposure of the PP layer 510 to the apodization light 702 may be single-sided, such that only one of the top 521 or bottom 522 surfaces (FIG. 5) are exposed. The exposure may also be double-sided, such that both the top 521 and bottom 522 surfaces are exposed. The top 521 and bottom 522 surfaces may be exposed simultaneously or sequentially, i.e. one after another. In embodiments where the wavelength $\lambda_{apodization}$ of the apodization light 702 is different from the grating forming wavelength $\lambda_{grating}$ of the grating forming light 704, the apodization light 702 may be absorbed by the PP layer 510 more strongly than the grating forming light 704. Strong absorption of the apodization light 702 causes the refractive index contrast of the volume gratings 520 to be reduced at the top 521 and bottom 522 surfaces as compared to the refractive index contrast within the PP layer 510, e.g. at a middle thickness of the PP layer 510. A duration of exposure of the PP layer 510 to the apodization light 702 may be shorter than a duration of exposure of the PP layer 510 to the grating forming light 704.

Figure 8:
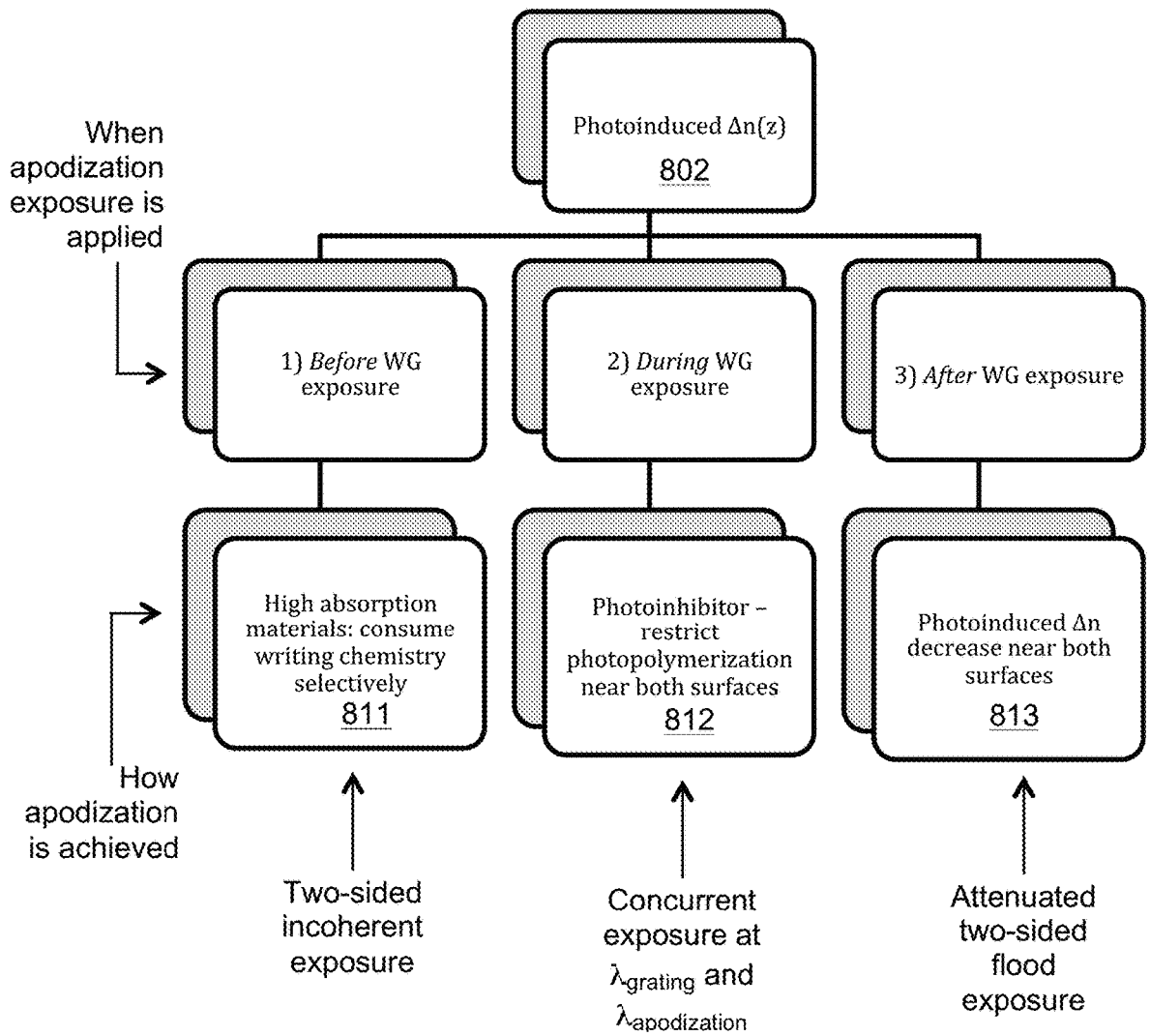
FIG. 8 is a chart showing a relationship between various embodiments of a method for providing volume grating refractive index contrast apodization in accordance with this disclosure.

Several non-limiting embodiments of a method of forming an apodized volume grating in the PP layer 510 of FIG. 5 are illustrated in FIG. 8 with further reference to FIGS. 7A to 7C. A volume grating may be apodized by photoinducing (FIG. 8; 802) a dependence of the refractive index contrast $\Delta n$ of a volume grating on a thickness coordinate z. The refractive index variation is obtained by exposing a photopolymer layer to grating forming light.

The specific chemical process(es) utilized to achieve the required degree of apodization $\Delta n(z)$ of a volume grating may depend on the order of application of the apodization exposure relative to the grating forming exposure. For example, in a first embodiment 811, the apodization exposure is applied before the grating forming exposure. This corresponds to FIG. 7A. The periodic refractive index variations in the PP layer 510 may be formed due to a photoreactive agent of the photopolymer being sensitive to illumination with the grating forming light 704. The amplitude of the periodic refractive index variations may be reduced due to the photoreactive agent being also sensitive to illumination with the apodization light 702. The apodization exposure may selectively consume some of the $\Delta n$ writing chemistry, i.e. the capacity of the photopolymer to undergo a photochemically induced change of the refractive index.

The writing chemistry does not necessarily need to be consumed, it could also be inhibited or otherwise have its overall sensitivity reduced, such that the refractive index variation $\Delta n$ is less proximate the opposed surfaces of the PP layer 510 as compared to the value of $\Delta n$ at the center of the PP layer 510, e.g. at Z-coordinate of half the thickness t. In the first embodiment 811, the apodization wavelength $\lambda_{apodization}$ may be different than the grating wavelength $\lambda_{grating}$, and may even be outside of the wavelength range of the grating forming light 704 altogether. For example, the apodization wavelength $\lambda_{apodization}$ may be selected to be within a strong absorption band of the photoreactive agent of the PP layer 510.

In a second embodiment 812, the apodization exposure is applied concurrently with the grating forming exposure. This corresponds to the previously considered FIG. 7B. In the second embodiment 812, the photopolymer recording material formulation may be modified to incorporate not only a photoreactive agent for forming the periodic refractive index variations by a photoreaction (i.e. photopolymerization) to the grating forming light, but also an additional component such as, for example, a photoinhibitor agent for impeding the photoreaction when illuminated with the apodization light. The "inhibiting" exposure wavelength $\lambda_{inhibit}$ may be different from the grating forming wavelength $\lambda_{grating}$ In some variants of the second embodiment 812, the material formulation for the PP layer 510 may be designed to be wavelength-orthogonal, in other words, the apodization light 702 at the wavelength $\lambda_{inhibit}$ substantially does not activate the photoreactive agent, i.e. does not induce polymerization, and the grating forming light 704 at the grating forming wavelength $\lambda_{grating}$ substantially does activate the photoinhibitor agent, i.e. does not induce inhibition of the photopolymerization reaction. In some variants, the photochemical process and material composition are selected such that no other reactions may occur. The light exposure may be synchronized, and a relative irradiation may be varied to fine tune the depth of refractive index modulation, $\Delta n(z)$. Photoinhibitor additive materials may undergo photolysis to produce a radical for polymerization termination. Non-limiting examples of such materials include butyl nitrite, hexaarylbiimidazole, and tetraethylthiuram disulfide (TED).

In a third embodiment 813, the apodization exposure is applied after the grating forming exposure, as illustrated in FIG. 7C. The purpose of the apodization exposure in this case is to locally induce a change the refractive index n and/or the refractive index variation $\Delta n$ of the formed grating. The photopolymer material formulation may include photoreactive groups whereby the photoreaction results in a change in refractive index variation $\Delta n$, and/or photoreactive groups causing increase or decrease of the refractive index n. This may be achieved by a reversible photopolymerization in such groups as azobenzene, stilbene, spiropyran, diarylethene; by photoelimination in diazo and/or azido groups; an additional step of photopolymerization/crosslinking independent of the photopolymerization for the volume grating exposure; photoisomerization; and/or by photolocking. In some embodiments, the apodization exposure may initiate depolymerization/decrosslinking reactions that allow high/low refractive index moieties in bright/dark fringes to diffuse and become spatially uniform. In some embodiments, isomerization reactions such as Photo-Fries rearrangement disclosed in Optical Materials 35 (2013) 2283-2289 incorporated herein by reference, and/or Calixarene isomerization disclosed in Bull. Chem. Soc. Jpn., 77, 1415-1422 (2004)) incorporated herein by reference, may be used.

For any of the embodiments considered herein, the apodization wavelength $\lambda_{apodization}$ of the apodization light 702 may be selected for the apodization light 702 to be strongly absorbed by the recording material of the PP layer 510. For example, no more than 5% of the optical power of the apodization light 702 may be transmitted through the PP layer 510 in some embodiments. The absorption of the apodization light 702 ensures that the refractive index contrast Δn is reduced only at the opposed surfaces of the PP layer 510 where the exposure of the PP layer 510 to the apodization light 702 is high. The apodization light 702 may be provided for a short amount of time, e.g. less than 1 second. The apodization exposure energy may be controlled with high precision and spatial uniformity, e.g. less than 5% non-uniformity of the apodization light 702 exposure. In embodiments where the apodization and exposure wavelengths are different, the PP layer 510 can be optimized for holographic recording with a low absorption at $\lambda_{grating}$ and high absorption at apodization wavelength $\lambda_{apodization}$.

In some embodiments, the apodization light 702 exposure does not consume the dynamic range of the PP layer 510 considerably, e.g. the dynamic range reduction due to the apodization light 702 exposure may be less than 10-20%. For example and without limitation, the number of groups photopolymerized by the apodization light may be kept to a minimum while providing apodization of the refractive index contrast Δn. The apodization light 702 may be provided immediately before, or within a pre-defined time interval, of the intended exposure of the PP layer 510 with the grating forming light 704.

The wavelength at which photoreactive groups absorb may be outside of the visible light spectrum, typically in ultraviolet wavelength range. In some embodiments, the photoreactive groups are located on the photopolymer backbone. Photoinduced apodization methods disclosed herein may induce strong Δn modulation without significantly changing the base refractive index, shrinkage properties, or other factors which may affect a Bragg reflection condition through the thickness of the PP layer 510, before, during, or after the exposure(s). Otherwise, a complementary method for modifying these may be used to obtain the desired grating response.

In some embodiments, the grating apodization is chemically induced, or a chemical apodization of the grating complement the photoinduced apodization considered above. An overall geometry of a chemical apodization embodiment is presented in FIG. 9, where chemically active layers 920, or inhibitor layers, are provided on opposed parallel sides of the PP layer 510. At least one active layer 920 may be provided. The volume gratings, e.g. VBGs or volume holograms, may be formed by illuminating the PP layer 510 with the grating forming light. The grating formation may be impeded by a reactive agent present in the chemically active layers 920, e.g. by controllably suppressing the photopolymerization process to reduce an amplitude of the periodic refractive index variations of the grating 520.

Figure 9:
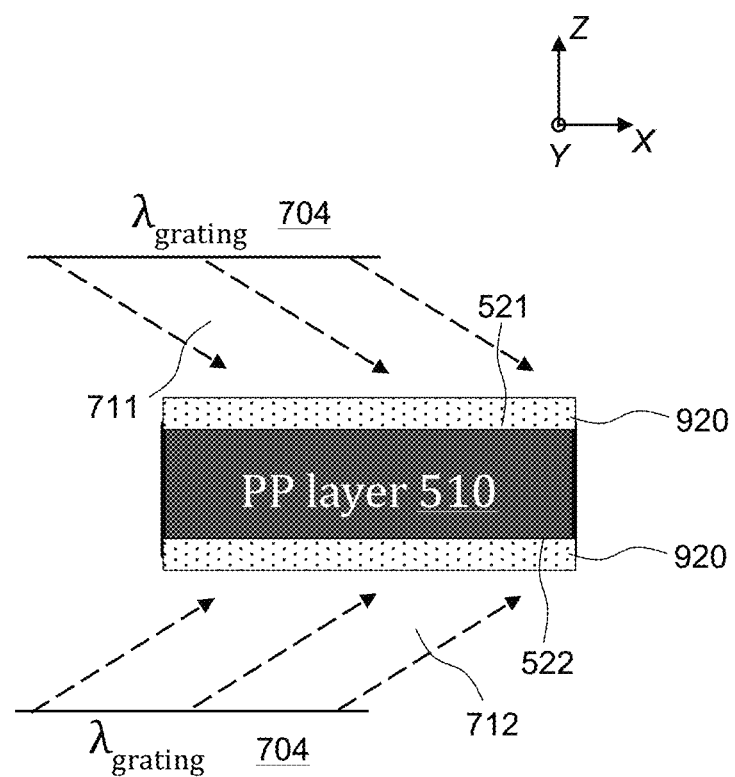
FIG. 9 is a schematic diagram of exposing a photopolymer layer sandwiched between layers facilitating a chemically induced apodization.
Figure 10:
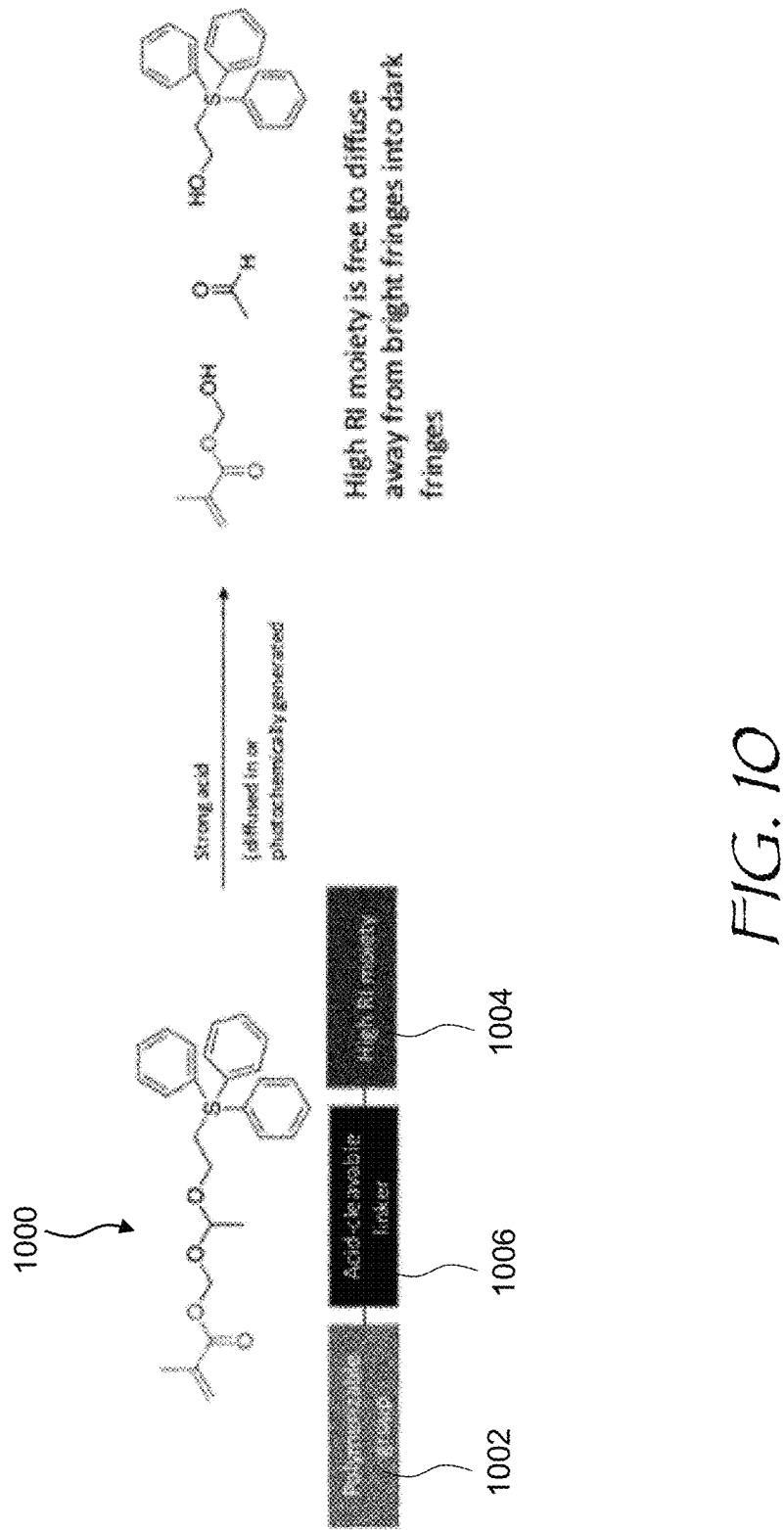
FIG. 10 is an example chemical structure of the photopolymer layer of FIG. 9.

The amplitude of the periodic refractive index variations of the grating 520 may be reduced using a variety of chemical processes. For example, after the grating forming photopolymerization, end groups of a polymerized photopolymer may be separated chemically and/or photochemically, followed by a diffusion of the separated end groups away from their original locations, causing the formed grating to be washed out. Referring to FIG. 10, a photopolymer 1000 includes a photopolymerizable group 1002 connected to an end group 1004 by an acid-cleavable linker group 1006. The end group 1004 may be a high refractive index moiety, such that the local refractive index is defined, at least in part, by the end group 1004. The reactive agent in the chemically active layer(s) 920 (FIG. 9) may include an acid for separating the end group 1004 (FIG. 10) from the photopolymerizable group 1002 by reacting with the acid-cleavable linker group 1006. The end group 1004 may be separated from the corresponding photopolymerizable group by application of the acid to at least one of the outer surfaces 521, 522 of the PP layer 510 (FIG. 9). The separated end groups 1004 (FIG. 10) diffuse away after separation, thereby reducing the amplitude of the periodic refractive index variations proximate the surface where the acid was applied. The acid may enter the PP layer 510 by diffusion from the chemically active layer(s) 920, and/or may be photochemically generated in the PP layer 510.

Figure 11:
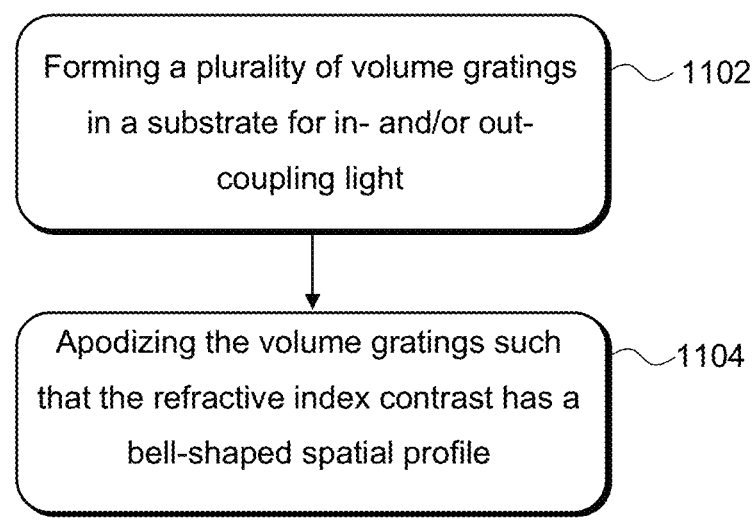
FIG. 11 is a flow chart of a method of fabrication of a grating coupler of this disclosure.

Turning to FIG. 11, a general method 1100 of fabrication a grating coupler includes forming (1102) a plurality of volume gratings of an in-coupler or an out-coupler. The volume gratings may be apodized (1104) to achieve a desired spatial profile of the refractive index contrast Δn(z). Steps 1102 and 1104 may be performed in any order. The order of performing the steps 1102 and 1104 may depend on the chemistry used to achieve the grating apodization. In some embodiments, the forming step 1102 includes exposing a photopolymer layer to grating forming light, and the apodization step 1104 includes exposing at least one surface of the photopolymer layer to apodization light, and/or exposing the at least one surface to a reactive agent, as explained above with reference to FIGS. 7A, 7B, 7C, FIG. 8, and FIG. 9.

Figure 12:
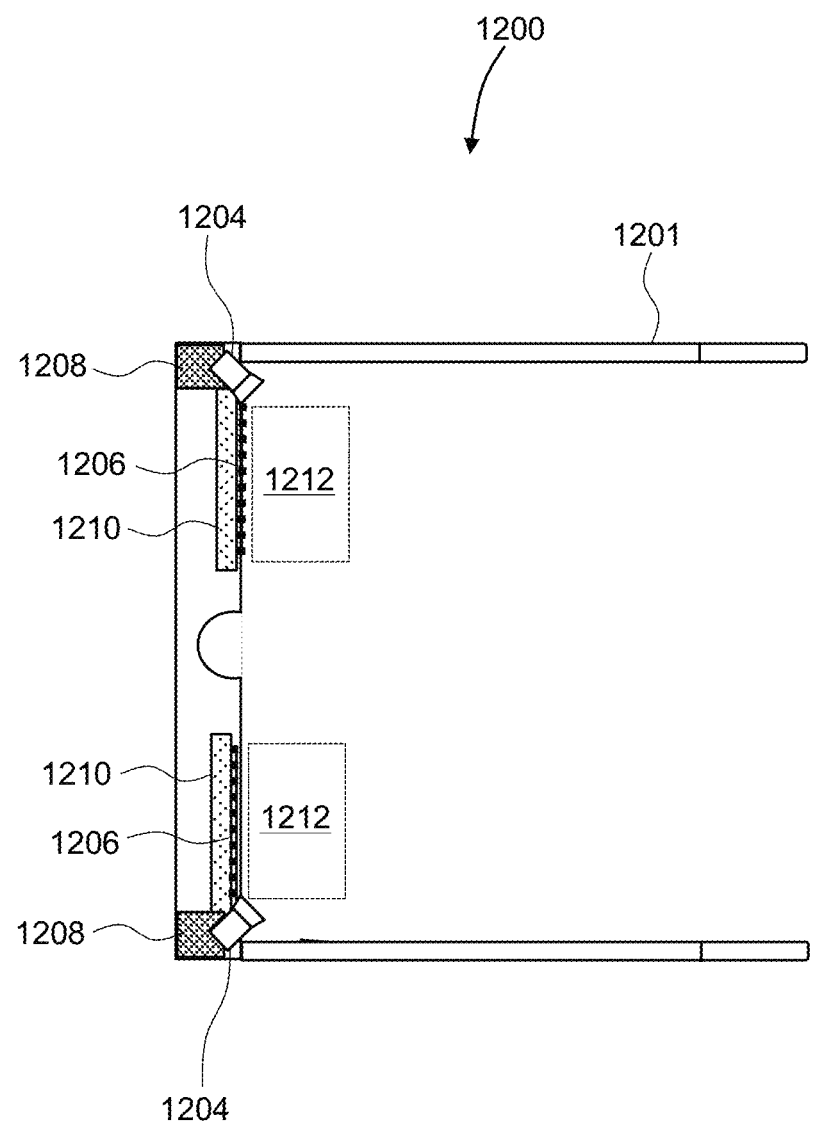
FIG. 12 is schematic a view of an augmented reality (AR) display of this disclosure having a form factor of a pair of eyeglasses.

Referring to FIG. 12, an augmented reality (AR) near-eye display 1200 includes a frame 1201 having a form factor of a pair of eyeglasses. The frame 1201 supports, for each eye: a projector 1208 including a laser light source described herein, a pupil-replicating lightguide 1210 optically coupled to the projector 1208, an eye-tracking camera 1204, and plurality of illuminators 1206. The pupil-replicating lightguide 1210 may include any of the grating-based in-couplers and/or out-couplers including the volume gratings as described herein. The illuminators 1206 may be supported by the pupil-replicating lightguide 1210 for illuminating an eyebox 1212. The projector 1208 provides a fan of light beams carrying an image in angular domain to be projected into a user's eye. The pupil-replicating lightguide 1210 receives the fan of light beams and provides multiple laterally offset parallel copies of each beam of the fan of light beams, thereby extending the projected image over the eyebox 1212.

The purpose of the eye-tracking cameras 1204 is to determine position and/or orientation of both eyes of the user. Once the position and orientation of the user's eyes are known, a gaze convergence distance and direction may be determined. The imagery displayed by the projectors 1208 may be adjusted dynamically to account for the user's gaze, for a better fidelity of immersion of the user into the displayed augmented reality scenery, and/or to provide specific functions of interaction with the augmented reality.

In operation, the illuminators 1206 illuminate the eyes at the corresponding eyeboxes 1212, to enable the eye-tracking cameras to obtain the images of the eyes, as well as to provide reference reflections i.e. glints. The glints may function as reference points in the captured eye image, facilitating the eye gazing direction determination by determining position of the eye pupil images relative to the glints images. To avoid distracting the user with illuminating light, the latter may be made invisible to the user. For example, infrared light may be used to illuminate the eyeboxes 1212.

Embodiments of the present disclosure may include, or be implemented in conjunction with, an artificial reality system. An artificial reality system adjusts sensory information about outside world obtained through the senses such as visual information, audio, touch (somatosensation) information, acceleration, balance, etc., in some manner before presentation to a user. By way of non-limiting examples, artificial reality may include virtual reality (VR), augmented reality (AR), mixed reality (MR), hybrid reality, or some combination and/or derivatives thereof. Artificial reality content may include entirely generated content or generated content combined with captured (e.g., real-world) content. The artificial reality content may include video, audio, somatic or haptic feedback, or some combination thereof. Any of this content may be presented in a single channel or in multiple channels, such as in a stereo video that produces a three-dimensional effect to the viewer.

Furthermore, in some embodiments, artificial reality may also be associated with applications, products, accessories, services, or some combination thereof, that are used to, for example, create content in artificial reality and/or are otherwise used in (e.g., perform activities in) artificial reality. The artificial reality system that provides the artificial reality content may be implemented on various platforms, including a wearable display such as an HMD connected to a host computer system, a standalone HMD, a near-eye display having a form factor of eyeglasses, a mobile device or computing system, or any other hardware platform capable of providing artificial reality content to one or more viewers.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabrication of a grating coupler, the method comprising:
    exposing a photopolymer layer having a thickness between opposed first and second surfaces to grating forming light for forming periodic refractive index variations in the photopolymer layer; and
    exposing the first surface of the photopolymer layer to apodization light for reducing an amplitude of the periodic refractive index variations proximate the first surface.

2. The method of claim 1, further comprising exposing the second surface of the photopolymer layer to apodization light for reducing an amplitude of the periodic refractive index variations proximate the second surface.

3. The method of claim 1, wherein the first surface of the photopolymer layer is exposed to the apodization light before the photopolymer layer is exposed to the grating forming light.

4. The method of claim 1, wherein a wavelength of the grating forming light is different from a wavelength of the apodization light, whereby the apodization light is absorbed in the photopolymer layer stronger than the grating forming light.

5. The method of claim 4, wherein a transmittance of the photopolymer layer at the wavelength of the apodization light is no greater than 5%.

6. The method of claim 4, wherein the periodic refractive index variations in the photopolymer layer are formed due to a photoreactive agent of the photopolymer layer being sensitive to illumination with the grating forming light, wherein the amplitude of the periodic refractive index variations is reduced due to the photoreactive agent being sensitive to illumination with the apodization light.

7. The method of claim 4, wherein a duration of the exposure of the photopolymer layer to the apodization light is shorter than a duration of the exposure of the photopolymer layer to the grating forming light.

8. The method of claim 1, wherein the exposure of the photopolymer layer to the apodization light is performed concurrently with the exposure of the photopolymer layer to the grating forming light.

9. The method of claim 8, wherein the photopolymer layer comprises a photoreactive agent for forming the periodic refractive index variations by a photoreaction to the grating forming light, and a photoinhibitor agent for impeding the photoreaction when illuminated with the apodization light;
    wherein a wavelength of the grating forming light is different from a wavelength of the apodization light.

10. The method of claim 9, wherein the grating forming light substantially does not activate the photoinhibitor agent, and the apodization light substantially does not activate the photoreactive agent.

11. The method of claim 9, wherein:
    the photoreaction comprises photopolymerization;
    the photoinhibitor agent undergoes photolysis when illuminated with the apodization light to produce a radical for impeding the photopolymerization; and
    the photoinhibitor agent comprises at least one of butyl nitrite, hexaarylbiimidazole, or tetraethylthiuram disulfide.

12. The method of claim 1, wherein the exposure of the photopolymer layer to the apodization light is performed after the exposure of the photopolymer layer to the grating forming light.

13. The method of claim 12, wherein the photopolymer layer comprises a photoreactive group that reduces the amplitude of the periodic refractive index variations upon illumination with the apodization light by at least one of photoisomerization, photoelimination, photopolymerization, or photolocking.

14. The method of claim 13, wherein the photoreactive group comprises at least one of azobenzene, stilbene, spiropyran, diarylethene, a diazo group, or an azido group.

15. The method of claim 13, wherein the photoreactive group is on a polymer backbone of the photopolymer layer.

16. A grating coupler for a waveguide, the grating coupler comprising:
    a photopolymer layer having a thickness between opposed first and second surfaces, the photopolymer layer comprising periodic refractive index variations due to exposure to grating forming light;

wherein an amplitude of the periodic refractive index variations proximate the first surface is reduced by exposing the first surface the photopolymer layer to apodization light.

17. The grating coupler of claim 16, wherein an amplitude of the periodic refractive index variations proximate the second surface is reduced by exposing the second surface the photopolymer layer to apodization light.

18. The grating coupler of claim 16, wherein the periodic refractive index variations in the photopolymer layer are formed due to a photoreactive agent of the photopolymer layer being sensitive to illumination with the grating forming light, wherein the amplitude of the periodic refractive index variations is reduced due to the photoreactive agent being sensitive to illumination with the apodization light.

* * * * *